United States Patent [19]

Swanson

[11] Patent Number: 4,879,558

[45] Date of Patent: Nov. 7, 1989

[54] DATA COMPRESSION APPARATUS AND METHOD FOR DATA RECORDER WITH WAVEFORM ENVELOPE DISPLAY

[75] Inventor: Scott C. Swanson, Roswell, Ga.

[73] Assignee: Sangamo Weston, Inc., Norcross, Ga.

[21] Appl. No.: 5,962

[22] Filed: Jan. 22, 1987

Related U.S. Application Data

[63] Continuation-in-part of Ser. No. 940,999, Dec. 12, 1986.

[51] Int. Cl.$^4$ .............................................. H03M 7/00
[52] U.S. Cl. ...................................... 341/51; 341/123
[58] Field of Search ................ 340/347 AD, 347 DD; 381/42; 341/51, 95, 106, 123

[56] References Cited

U.S. PATENT DOCUMENTS

| | | | |
|---|---|---|---|
| 3,919,479 | 11/1975 | Moon et al. | 381/42 |
| 4,302,775 | 11/1981 | Widergren et al. | 358/136 |
| 4,586,027 | 4/1986 | Tsukiyama et al. | 340/347 DD |
| 4,673,916 | 6/1987 | Kitamura et al. | 340/347 AD |

OTHER PUBLICATIONS

"Optimum, FIR Digital Filter Implementations for Decimation, Interpolation, and Narrow-Band Filtering", Ronald E. Crochiere & L. R. Rabiner, IEEE Transactions on Acoustics, Speech, and Signal Processing, vol. ASSP-23, No. 5, Oct. 1975, pp. 444-456.

"A Novel Implementation for Narrow-Band FIR Digital Filters", L. R. Rabiner & R. E. Crochiere, IEEE Transactions on Acoustics, Speech, and Signal Processing, vol. ASSP-23, No. 5, Oct. 1975, pp. 457-464.

"A Signal Processing Implementation for an IBM-PC-based Workstation", N. K. Riedel, et al., IEEE Micro, Oct. 1985, pp. 52-67.

*IC Schematic Source Master*, Kendall Webster Sessions, Section 14, pp. 467, 470-471, 483.

*Modern Electronic Circuits Reference Manual*, John Markus, 1980, pp. 1160-1161.

*Data Compression*, Gilbert Held, Table of Contents, pp. 20-26, 49-53.

*Data Compression*, Thomas J. Lynch, Ph.D., Table of Contents, pp. 63-67.

The Engineering Staff of Analog Devices, Inc., *Analog-Digital Conversion Handbook*, Jun. 1972, p. I-34.

Primary Examiner—William M Shoop, Jr.
Assistant Examiner—Marc S. Hoff
Attorney, Agent, or Firm—Sanford J. Asman

[57] ABSTRACT

A data compression method and appartus particularly suitable for use in electrical power line fault data recorders. The system performs both gain compression and frequency compression. For gain compression, a predetermined number of samples are analyzed to determine a gain setting common to each sample in the set of samples. A reduced data string consisting of a gain code and data words having fewer bits than the input words are transmitted as a compressed data string. For frequency compression, a sample set representing the input signal is decimated until there remain only a sufficient number of data samples to satisfy the Nyquist criterion for the highest frequency component of interest. Also included is a circuit for reproducing the waveform envelope. Positive and negative peak detectors provide signals representative of the peaks of the waveforms. These positive and negative signals are then compressed with the gain compression circuit, decompressed after transmission or recall, and then displayed as an envelope waveform for allowing trend analysis.

45 Claims, 10 Drawing Sheets

Gain Compression

Table I

| FREQUENCY CODE | HIGHEST FREQUENCY OF INTEREST | TIME BETWEEN SAMPLES |
|---|---|---|
| 0 | f = 60 Hz | 8.33 mS |
| 1 | 120 | 4.17 mS |
| 2 | 180 | 2.78 mS |
| . | . | . |
| . | . | . |
| . | . | . |
| 30 | 1860 | 540 μS |
| 31 | 1920 | 520 μS |

Envelope Detection - Trend Analysis

Envelope Detect Circuit

DATA COMPRESSION APPARATUS AND METHOD FOR DATA RECORDER WITH WAVEFORM ENVELOPE DISPLAY

Cross Reference to Related Application

This application is a continuation-in-part of application Ser.No. 940,999, filed Dec. 12, 1986.

Technical Field

The present invention relates generally to data compression and data recorders, and more particularly relates to data compression techniques for use in electrical power line fault detectors/recorders which allow a reduction in the amount of information to be stored, transmitted, or analyzed in connection with the detection/recording and analysis of a fault condition on an electrical power transmission line.

Background of the Invention

In certain industries such as electrical utilities and oil well logging industry, large amounts of data obtained from monitoring and testing are processed and analyzed to yield useful information. For example, in the electrical utility industry, data recorders monitor electrical power lines for signal fluctuations indicative of problems in the transmission line. Typical power line fault recorders record analog data from the voltages and currents generation stations. Some conventional data recorders operate constantly even when no problems are present, generating enormous amounts of data which yield little useful information. When a problem such as a lightning strike or a tree falling on a line or the like occurs, a skilled analyst can examine the characteristics of the data (such as rise times, transient characteristics, and durations of signals) and ascertain the location and nature of the fault. For example, when a fault is detected in an electrical power line, it is important for the data containing information about the fault to be relayed as quickly as possible to the personnel responsible for analyzing and correcting the fault. Typically, these personnel display the data graphically and look for tell-tale patterns indicative of certain common known types of faults, e.g. a tree falling on a transmission line.

Often, however, these personnel are remote from the substation or generating facility where the monitoring equipment is located. Thus, the data must be transmitted via a telephone line and modem link, or physically transported on a medium such as magnetic tape. Needless to say, transmission of large amounts of data at standard rates of 2400 baud is inordinately slow, and storage of such data on magnetic tape is not a preferable alternative because of the weight and bulk of the reels or cartridges of tape. While often the resolution of the data is not critical for graphic display, the speed of acquiring the data is essential so that the power outage time can be minimized.

In many typical power line monitoring data recorders, components known as continuous monitoring equipment ("CME") detect the occurrence of a fault condition and initiate the recording of data for subsequent analysis. Large amounts of data provided during normal operation accordingly need not be saved, resulting in some savings in transmission volume and speed.

However, the CME requires a finite amount of time to detect the occurrence of a fault. Thus, when a fault has been detected, a predetermined amount of data prior to the occurrence of the fault must somehow be saved for analysis, since the data immediately prior to the fault often provides the most useful information as to the nature of the fault. Typically, electrical utility CME continuously record data and store it in a temporary buffer so that when a fault is recognized, the data in the temporary buffer prior to the fault plus data corresponding to the fault is preserved.

Data recording for other applications such as seismic recording and nuclear testing also produce vast amounts of data which must be either recorded at high speed, buffered, or compressed for later analysis. Often, digital tape drives are employed for saving the data into a permanent storage medium for subsequent analysis. Typical magnetic tape drives used in such data recorders can operate at speeds of up to 100 inches per second, for nine tracks with a packing density of 1600 bits per inch per track. Although these are high density, high speed recorders, in some applications the amount of data being accumulated to provide the desired resolution is greater than the recording ability of the tape drives, requiring either multiple tape drives or data compression schemes.

Another limitation encountered with digital CME is that most systems can only record a predetermined number of seconds' worth of data. However, certain types of faults encountered in power line monitoring applications involve system voltage level swings which occur over many seconds or even over several minutes. In these cases, the personnel monitoring the system may be more interested in voltage trends over long periods of time as opposed to specific waveforms at higher frequencies. With conventional CME, the personnel must play back the data from the CME at very slow speeds so as to generate an envelope for the overall waveform. Accordingly, there is a need for CME having the ability to provide a display of a power line waveform envelope without requiring inefficient slow speed playback of data on the CME.

In these and other data recording devices, data compression techniques are frequently used to reduce the volume of data prior to storage or transmission. These techniques can result in greater transmission speeds and storage densities. Many types of data compression techniques are known in the art. These techniques fall basically into two primary categories: (1) logical compression (also called "redundancy reduction") and (2) physical compression (also called "entropy reduction"). Logical compression is a data dependent technique and results from the elimination of redundant fields of information while representing data elements in remaining fields with as few logical indicators or codes as is feasible. Physical compression or entropy reduction is typically viewed as the process of reducing the quantity of data prior to it entering a transmission channel or storage medium and the subsequent expansion of such data to its original format upon receipt or recall. Physical compression necessarily results in loss of information, since data which may contain useful information is deliberately discarded.

One particular compression technique employed in seismologic recording involves a gain-switchable analog to digital converter which selects one of four different gain ranges for a particular data sample. Two bits of data are added to each digital data sample for encoding gain information. Thus, at the instant of sampling, a two-bit gain code is obtained representative of which one of four possible amplitude ranges is associated with the sample. The gain code is used to select one of four analog amplifiers on the input to the D/A converter prior to digitizing the sample. The digital output of the D/A converter, plus the two-bit gain code, then constitutes the reduced data. While this technique results in a degree of data compression and reduced bandwidth, it fails to take advantage of the fact that a plurality of consecutive samples may have the same gain code, resulting in the transmission of much redundant information. Thus, the compression efficiency for this scheme is not particularly great.

SUMMARY OF THE INVENTION

The present invention provides an improved data compression method and apparatus. The technique is particularly suitable for use in powerline fault monitoring equipment, but may also find application in other types of data recorders. Briefly described, the system performs the data compression by receiving a predetermined number of digital input data samples representing an input information signal during a sampling period. The samples are then analyzed to obtain a compression parameter corresponding to the magnitude of an information parameter of the input information signal. For example, the information parameter can be amplitude, and the compression parameter can be a gain compression factor or code which is related to the magnitude of the amplitude of the input signal at its peak level during the sampling. Alternatively, the information parameter can be frequency, and the compression parameter can be a frequency compression factor or code which is related to the highest frequency component contained in the information signal during the sampling which exceeds a predetermined threshold magnitude.

Then, a predetermined portion of the data samples is selected in response to the compression parameter to provide a second predetermined number of compressed digital data samples. The second predetermined number of compressed data samples contains less data than the original input samples. For example, if gain compression is performed, then there is provided the same number of compressed data samples, but each sample has fewer bits than the original input samples. If frequency compression is performed, then there are provided fewer compressed data samples by discarding unneeded samples.

As an output, the system provides a compressed data stream comprising (1) a word containing the compression parameter and (2) the second predetermined number of compressed data samples. The present invention operates in a manner somewhat analogous to adaptive sampling. However, in the present invention the data is sampled at an extremely high rate so as to preserve all information as to signal amplitude and frequency components. Then, the data is reduced by gain ranging and/or frequency ranging to reduce the amount of data that is actually stored or transmitted after sampling.

A preferred application of the present invention is, as described above, for use in electrical power line fault continuous monitoring equipment. Another aspect of the present invention is the provision of waveform envelope trend display. By taking approximately one sample per line cycle at the peaks of the waveform over long periods of time, storing the data in memory, compressing the data, and playing it back just as a trendline, the preferred embodiment of the present invention displays the waveform trend without requiring slow speed playback of the equipment. Briefly described, a preferred waveform envelope monitoring and display apparatus comprises means for sampling signals representative of the peaks of the waveforms occurring on the electrical power line. The signals representative of the peaks are then compressed for transmission or storage in the manner described above for other data. After transmission or upon recall from storage, the compressed data is decompressed and displayed in a manner so as to reconstruct an envelope waveform which corresponds to the envelope of signals occurring on the electrical power line.

More particularly described, the apparatus and method comprises providing a predetermined number n of input data samples, each sample having a word length of M bits. When gain compression is performed, the system is responsive to detect the highest magnitude of the input signal during the sampling period of n samples. The compression method involves selecting a predetermined number k bits of each one of the data samples, where k is less than m. There is then provided a predetermined number n of nk- bit compressed data samples, plus a gain code which corresponds to the detected greatest magnitude of the samples in the set of n samples.

Take for example a twelve bit input digital signal (m=12). If the signal during the sampling period is so great that the most significant bit is a "one" at any time during the sampling, then it is known that the signal has excursions near to the limits of the A/D converter. Reduction is accomplished by gain scaling the samples by discarding the four least significant bits of each sample, leaving the eight most significant bits per sample (k=8), and by providing a gain code indicating maximum gain. If on the other hand the signal during the sampling period results in a "one" only on the third most significant bit, then gain scaling need not be so great. Then, reduction is accomplished by gain scaling the samples by discarding the two most significant bits (which were not utilized during the sampling period), and by discarding the two least significant bits. A gain code indicating medium gain is then provided together with the eight-bit reduced data sample.

Still considering the example, if the input signal does not exceed bit eight of twelve bits during the sampling period, then the four most significant bits of each sample are discarded, and the eight least significant bits are transmitted together with a gain code of zero. It will thus be appriciated that if any four of twelve bits are to be discarded to reduce the m=12 bit input word to a k=8 bit word, there can be five different possible gain codes associated with the set of data samples.

Where frequency is the compression parameter, the system first analyzes the number n of input data samples to determine the highest frequency component present in the set of samples. In one embodiment, this is accomplished by performing a Fourier transform using known mathematical algorithms such as the fast Fourier transform (FFT) to determine the highest frequencies present in the signal. For example, in power line monitoring, the fundamental frequency in the input samples will be F=60 Hertz (Hz); during the occurrence of a fault, higher order harmonics of 2 F, 3 F, . . . 20 F or higher may be present. In response to the set of n data samples, the magnitudes of the frequency components are compared to a predetermined threshold magnitude to determine the highest frequency component present during the sampling period.

For example, in many fault line monitoring applications, the highest frequency of interest does not usually exceed 1500 Hz. Assume further that the number of data samples is n=3840 samples. Thus, if it is detected that frequency components as high as 1920 Hz are present in the set of input data samples, then all data samples will be stored or transmitted since at least 2×1920=3840 samples are required to satisfy the Nyquist criterion for 1920 Hz.

On the other hand, if frequency components only as high as the third harmonic are present, the set of n data samples are reduced or decimated until there are only r samples remaining, where r is a large enough number of samples to satisfy the Nyquist criterion for the highest frequency component present, f=3F=180 Hz. In the example given, there would be r=360 samples minimum.

Still considering the previous example, if the highest frequency of interest is only 60 Hz, then the set of input samples is reduced by discarding data samples until the remaining data samples are sufficient in number to satisfy the Nyquist criterion for the highest frequency of interest, namely, 60 Hz.

In the preferred embodiment of the present invention, both the gain compression and the frequency compression methods are employed back-to-back, resulting in the provision of r compressed words of k bits each, from an input sample set of n words of m bits each. Advantageously, therefore, the present invention both reduces the redundant gain information which may be present in the set of input data, as well as the information content or entropy of the input data by discarding data samples which are not required to reproduce the highest frequency of interest in the input data set. The invention therefore allows greater efficiencies in the transmission of data via telecommunications links such as via modem and telephone line, plus greater data packing densities on recording media such as magnetic tape and disk.

Accordingly, it is an object of the present invention to provide an improved data compression method and apparatus.

It is another object of the present invention to provide a data compression method and apparatus suitable for use in power line fault monitoring applications.

It is another object of the present invention to provide an improved data compression method and apparatus which is responsive to the information content of the input information signal to reduce redundancy and entropy in order to obtain a compressed data signal.

It is another object of the present invention to provide an improved data compression method and apparatus which is responsive to the information content of the input signal to selectively compress the signal to reduce data storage requirement and/or communication channel bandwidth requirements.

It is another object of the present invention to provide an improved data compression method and apparatus which reduces data storage and/or transmission channel requirements for data which is to be graphically displayed for analysis.

It is another object of the present invention to provide an improved data compression method and apparatus which is able to store and/or transmit data corresponding to seldom-occurring but significant excursions from a normally expected signal without risk of data loss due to data samples which are off scale.

It is another object of the present invention to provide an improved electrical power line fault monitoring system wherein data corresponding to a fault can be relayed for analysis without requiring an inordinate amount of memory or time so that the electrical utility can obtain information pertaining to the fault as quickly as possible to facilitate rapid correction.

It is another object of the present invention to provide an improved electrical power line fault monitoring system wherein the envelope of the waveforms occurring on the electrical power line can be readily reproduced so that the voltage trend over long periods of time can be displayed and analyzed.

These and other objects, features, and advantages of the present invention may be more clearly understood and appreciated from a review of the following detailed description of the disclosed embodiments and by reference to the appended drawings and claims.

DETAILED DESCRIPTION OF THE PREFERRED EMBODIMENT

Figure 1:
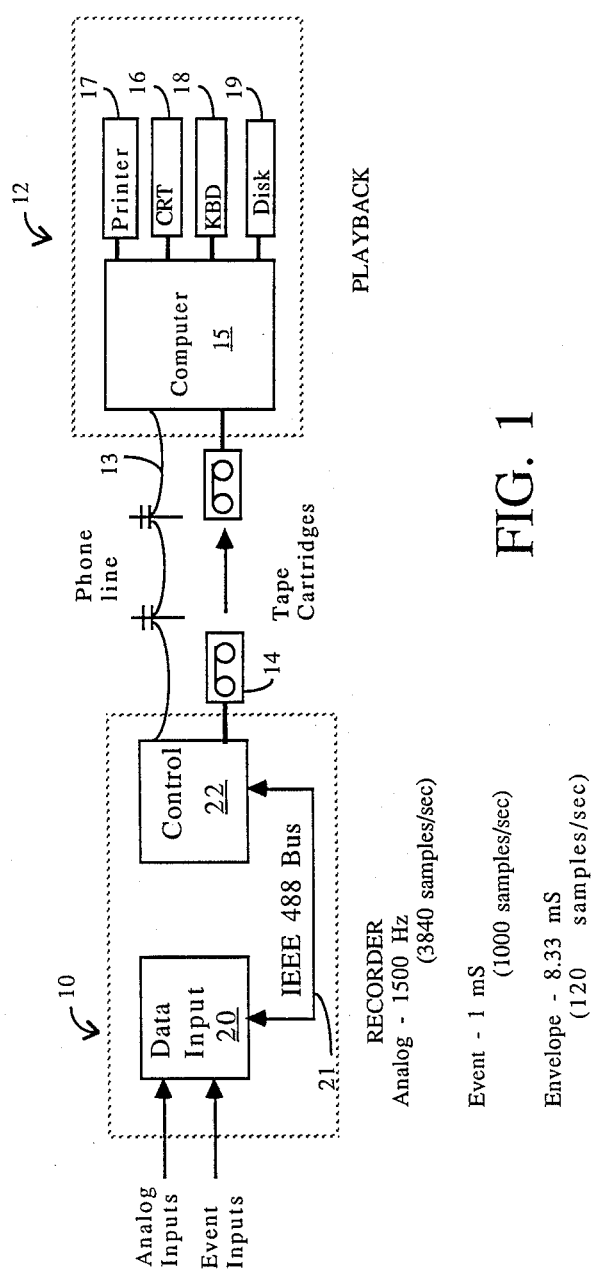
FIG. 1 is a schematic block diagram of a data recorder system employing the preferred embodiments of the present invention.

Referring now to the drawings, in which like numerals indicate like elements throughout the several views, FIG. 1 shows a preferred embodiment of a data recorder 10 and playback unit 12 constructed in accordance with the present invention. A system comprising one or more recorders 10 connected by a telephone line 13, or alternatively by physical transfer of data tape cartridges 14, is particularly suitable for use as an electricity fault data recorder. However, it should be understood that other types of data recorders, such as seismic data recorders or other scientific instrumentation data recorders, may also find application of the present invention.

Bearing in mind that the disclosed embodiment is merely exemplary of one use of the present invention, there will now be described the disclosed embodiment of the recorder 10 which is configured for use as an electricity power line fault data recorder. The recorder 10 comprises a data input section 20 which is connected via a signal bus 21 to a control section 22. In the preferred embodiment, the bus 21 is an IEEE 488 bus, the construction of which will be familiar to those skilled in the art. The data input section 20 and the control section 22 are illustrated in more detail in FIGS. 2 and 3, respectively.

The playback unit 12 comprises circuitry including a computer 15 and software which is responsive to compressed data received either over the telephone line 13, or alternatively received on tape cartridges 14, to reproduce the analog signal represented by the compressed data. In the preferred embodiment, the playback unit 12 comprises an International Business Machines (IBM) corporation personal computer (PC) 15 which is programmed to reverse the process to be described hereinbelow for data compression, thereby obtaining an analog signal which can be graphically displayed on a CRT monitor 16, or reproduced on a printer 17, for analysis by a person skilled in the art of power line fault analysis. The playback unit 12 will further include a keyboard 18 for data entry and control by the operator, and a hard disk 19 or other mass storage medium for storage of the data. After the discussion which follows, it will be understood how to reverse the compression process to recreate the input signal.

Figure 2:
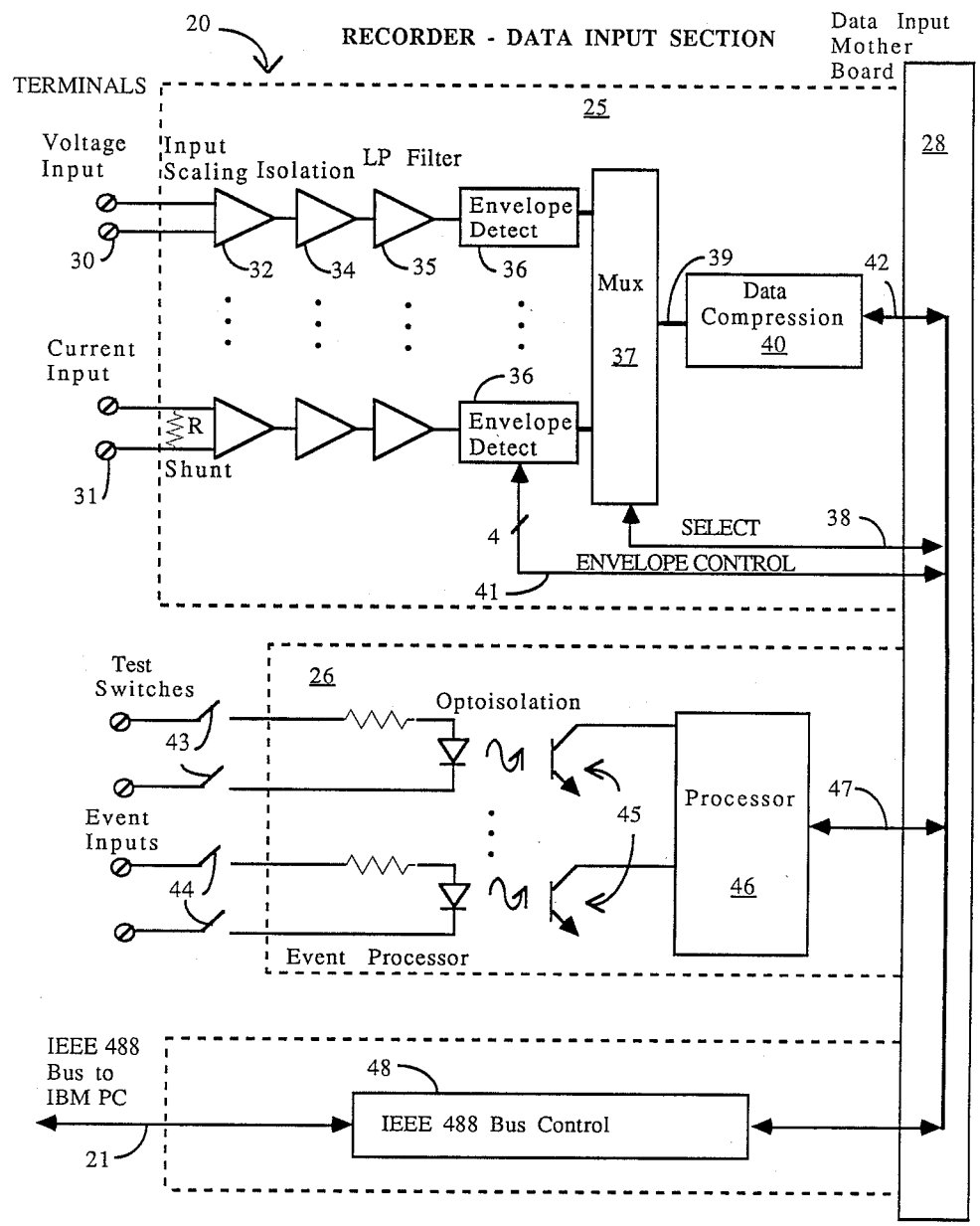
FIG. 2 is a detailed schematic diagram of the data input section of the recorder illustrated in FIG. 1.

Turning now to FIG. 2, the data input section 20 of the recorder is configured to receive several different types of inputs. The preferred data input section 20 illustrated in FIG. 2 is configured to monitor voltages and currents, as well as switch closures and openings which typically accompany a power line fault. For example, power line faults often trigger the opening of circuit breakers, and the location and timing of these "events" bear information as to the nature and location of the fault. Accordingly, the data input section in the preferred embodiment comprises an analog signal processor 25 and an event processor 26.

The analog signal processor 25 includes a plurality of input channels for monitoring electrical voltages and currents. Where the system is to monitor a voltage parameter, terminals 30 are provided. If a current input is to be monitored, terminals 31 would be employed, which are connected across a shunt resistor R. Each of the terminals 30, 31, whether voltage or current, are provided to the input of a high impedance input scaling amplifier such as indicated at 32. These amplifiers, which are conventional in nature, scale the input signal excursion to be within the operational limits of subsequent circuit stages. The outputs of the input scaling amplifiers 32 are then provided through isolation amplifiers 34 so as to provide isolation between logic ground of the circuitry and the inputs. Preferably, circuit components providing about 2500 volts AC isolation are provided.

The outputs of the isolation amplifiers 34 are provided through anti-aliasing or low pass filters 35 to the inputs of envelope detection circuits 36. The outputs of the envelope detection circuits 36 are then provided to an analog multiplexer (MUX) 37. The anti-aliasing filter band limits the input signal to the highest frequency of interest, 1920 Hz in the preferred embodiment. The envelope detection circuits 36 are operative to detect the peaks of the waveforms being provided as inputs from the filters 35. These circuits are illustrated in more detail in FIG. 10. In the preferred embodiment, a separate envelope detection circuit 36 is provided for each separate channel, of which a plurality are provided in the analog signal processor 25. Each envelope detection circuit 36 is controlled by control lines 41 denominated ENVELOPE CONTROL, which originate as commands from the CPU 50 that are passed to the data input motherboard 28 via the IEEE 488 bus lines 21. The output of each envelope detection circuit 36 is then provided to an analog multiplexer 37. The analog multiplexer 37 is a conventional four-to-one analog multiplexer such as a type AD7502 manufactured by Analog Devices, Inc., Norwood, Mass. The SELECT lines 38 for the multiplexer 37 are provided from the data input mother board 28 which receives signals from the other components in the recorder, as will be described later.

As will be understood by those skilled in the art, the multiplexer 37 is selectable so that the output of the multiplexer on line 39 is connected to one of a plurality of input terminals. In the preferred embodiment, the multiplexer 37 cycles through or "polls" by rotating among the input channels. In the preferred embodiment for power line monitoring, the data rate of the system is to sample each of the inputs sixty-four times per line cycle. This corresponds to 3840 samples per second for each input. Accordingly, the multiplexer cycles through four inputs at a rate four times the sampling rate, or 15,360 Hz.

It should be understood that the sampling rate of 3840 samples per second for each input corresponds to operation in a "normal" mode, wherein data samples for reproducing the entire waveform are obtained. The preferred embodiment disclosed herein is also selectively operable in an "envelope" mode, wherein data for reproducing only the envelope of the waveforms are obtained. Sampling at the rate of 3840 samples per second is not required for operation in the envelope mode. In the envelope mode, 120 samples per second for each input are taken per channel. Thus, in operation in a pure envelope mode, wherein no data other than that corresponding to the envelope are taken, the multiplexer 37 cycles through four inputs at a rate four times the sampling rate, or 480 Hz.

It should also be understood that in typical applications, the pure envelope mode is seldom used, although the disclosed embodiment is certainly capable of such operation. In most applications, data corresponding to operation in the normal mode and data corresponding to operation in the envelope mode are obtained on a time division multiplexed basis. In other words, for most applications data will be accumulated in the normal mode at the 3840 sample per second sampling rate, with less frequent samples being taken in the envelope mode at the 120 sample per second sampling rate.

The output of the multiplexer on line 39 is provided to a data compression circuit 40, wherein the data compression method of the present invention is carried out. The output of the data compression circuit is a digital data stream provided on lines 42 to the data input mother board.

The event processor 26 comprises means for detecting the occurrence of particular events, such as the opening of a circuit breaker in an electrical power facility. This capability allows the system to determine the time at which crucial events have taken place so that these events can be correlated to the characteristics of the signals being sampled by the analog signal processor 25. The event processor 26 comprises a plurality of test switches 43 and event input switches 44 which are connected through optoisolators 45 into a microprocessor circuit 46. The microprocessor 46 is a conventional microprocessor which merely detects the occurrence of the closure of one of the event switches 44 and provides a digital signal via lines 47 indicating which switch was closed and the time of closure to the data input mother board 28. The test switches 43 are provided solely as a troubleshooting aid.

Also as shown in FIG. 2, a conventional IEEE 488 bus control circuit 48 is provided for conducting signals from the analog signal processor 25 and the event processor 26 to the control section 22. The bus control circuit 48 is connected to the data input mother board 28, and provides signals over the IEEE 488 bus 21 to the circuitry illustrated in FIG. 3.

Figure 3:
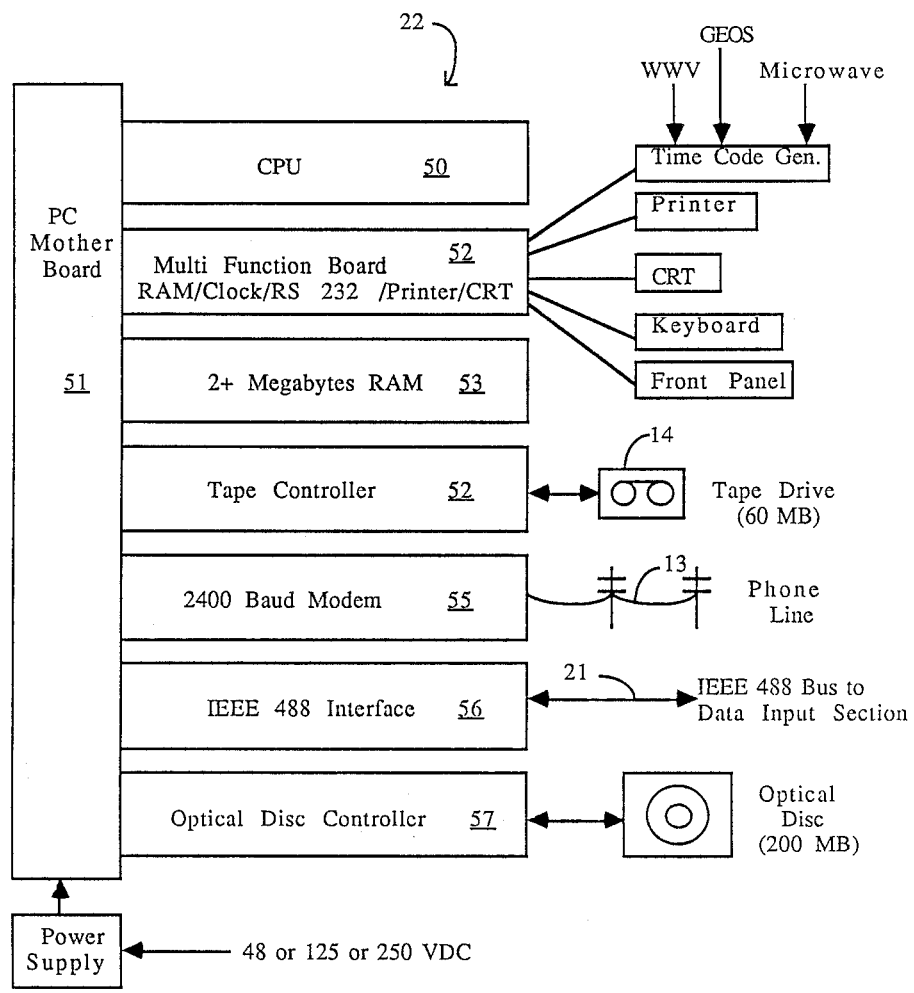
FIG. 3 is a detailed schematic diagram of the control section of the recorder illustrated in FIG. 1.

Turning now to FIG. 3, the control section 22 of the recorder will next be described. In the preferred embodiment, the control section 22 comprises a conventional International Business Machines (IBM) personal computer (PC) or compatible computer system 50 which can be configured with various peripheral devices plugged into a PC mother board 51 in the manner known to those skilled in the art. Peripherals employed in the preferred embodiment include a conventional multifunction board 52 which include random access memory (RAM), a real-time clock, RS232 standard interface connections, printer ports, and a CRT port. Attached to the multifunction board, or otherwise associated with the computer, are peripherals such as a printer, a CRT, a keyboard, a time code generator, and a front panel. The time code generator may be provided if a highly accurate clock is desired which can be synchronized by a GEOS (geostationary earth orbit satellite) satellite, a WWV, or microwave link from an external source. A front panel may include alarm indicators and switches for turning the system on and off, and for configuring the system to record or not.

Additional peripherals attached to the PC mother board 51 and shown in FIG. 3 include a RAM board 53 which serves as the data buffer for the compressed data samples. In the preferred embodiment, two megabytes of RAM storage are provided so that all data corresponding to a fault may be stored until removed by transferring to tape or by transmitting over a communications link.

A tape controller 54 is provided in the preferred embodiment for controlling a tape drive for mass data storage on magnetic tape cartridges 14. A 2400 baud modem 55 is provided for connection to a telephone line 13 for transmission of data to the playback unit 12 which may be located off site. An IEEE 488 interface board 56 provides a connection to the 488 bus control circuit 48 in the data input section 20. Finally, a mass storage device such as an optical disk may be provided, which is controlled in the preferred embodiment by an optical disk controller 57.

Those skilled in the art will understand how to configure the PC mother board 51 with the various functional circuits described above, and to program the computer 50 to control these various devices.

Prior to describing the data compression circuit 40, it is appropriate at this point to digress into an explanation of the compression technique employed in the preferred embodiment. Two primary techniques are employed in the preferred embodiment to effectuate data compression. The first technique is called "gain ranging", and the second technique is called "frequency ranging".

Figure 6:
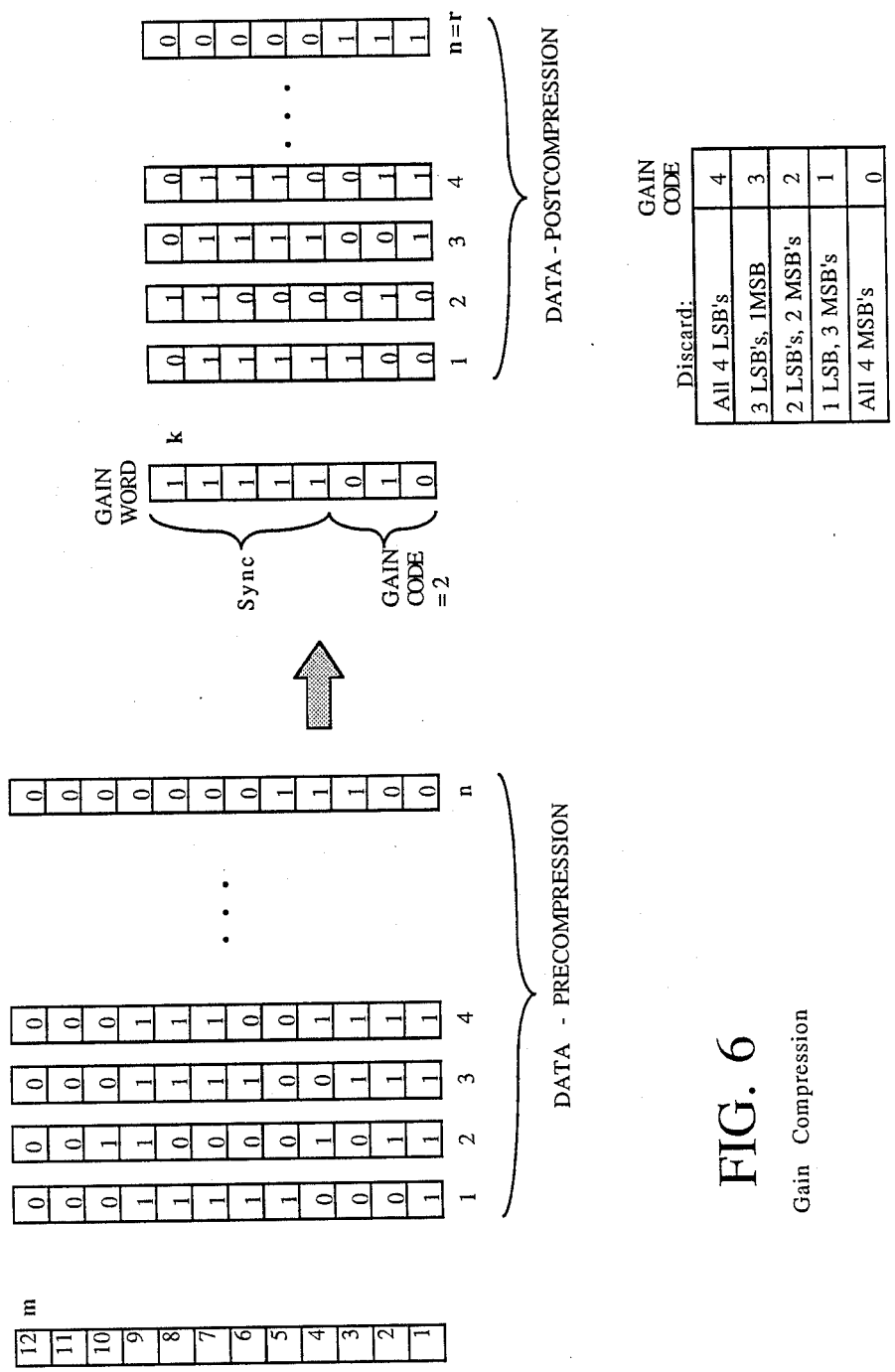
FIG. 6 illustrates the method of gain compression performed by the present invention.

In the gain ranging approach, a set of digitized data samples are analyzed and the sample having the greatest magnitude identified. Referring in this regard to FIG. 6, and assuming that there are 12-bit data samples, and n data samples in the set, the precompression data appears as shown in the left-hand portion of the figure. An inspection of these data samples will reveal that data sample 2 contains the sample having the greatest magnitude of the set of n samples. Assume further that the output data stream is to be reduced to n 8-bit data values. Accordingly, four bits of resolution must be removed from the precompressed samples.

In the example shown in FIG. 6, it will be noted that the two most significant bits in each data sample are always zero. Thus, in order to remove the greatest amount of redundancy while preserving the greatest amount of resolution, the two most significant bits and the two least significant bits will be discarded, thereby leaving n 8-bits samples. Associated with the n 8-bit sample will be a gain code, which in the preferred embodiment is transmitted as the first 8-bit word of information. The gain code word comprises five consecutive "ones" for synchronization, and three bits of gain information which signify which four bits of each sample have been discarded.

Inasmuch as it is possible to discard the four most significant bits, the four least significant bits, the three most significant bits and the least significant bit, the two most significant bits and the two least significant bits, or the three least significant bits and the most significant bit, there are five possible gain codes which can be transmitted. These are illustrated in the table in FIG. 6.

It should now be understood that where the information parameter of the input signal is amplitude, the gain compression parameter or gain code provided in the preferred embodiment is related to the magnitude of the amplitude of the input signal during the sampling period, wherein a first predetermined number n samples were obtained. Where each of the data samples comprises a data word having m bits, the method of the present invention selects a predetermined number k bits of each one of the data samples, where k is less than m to provide a second predetermined number r of k-bit compressed data samples. In the gain compression embodiment, it will be appreciated that the first predetermined number of data samples n equals the second predetermined number r of compressed data samples. In the preferred embodiment, $n=r=60, m=12$, and $k=8$. However, it should be understood that the number of samples processed for gain compression is not necessarily the same as the number of samples processed for frequency compression, as will be discussed later.

Figure 7A:
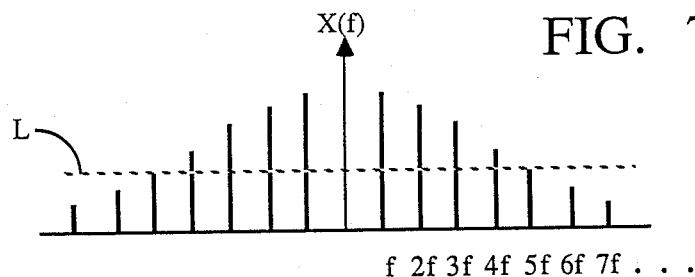
FIG. 7 illustrates frequency plots of input signals which are compressed with the frequency compression method performed by the present invention.

Referring next to FIG. 7, the present invention also performs what may be termed "frequency ranging". This involves providing only a sufficient number of samples of the input signal to satisfy the Nyquist criterion for the highest frequency of interest in the signal. For example, in power line monitoring the applications, there will most often be a fundamental frequency component at 60 Hz. Upon the occurrence of a fault, higher order harmonics of 60 Hz will often be present. One such situation is illustrated in FIG. 7A, where F equals 60 Hz. It will be observed that there are frequency components as high as 7F in this example.

Assume however that it is possible to graphically reproduce the input signal with satisfactory resolution for analysis purposes by a person skilled in the art of power line fault analysis with frequency components of 4F or lower. This being the case, there is no need to preserve information pertaining to the presence of frequency components above 4 F. In the preferred embodiment, the data samples are decimated or reduced so that information pertaining to frequency components above 4 F are not preserved. In other words, data samples are discarded until there remain only a sufficient number of data samples to satisfy the Nyquist criterion for frequency 4 F. By reconstructing the input signal employing the reduced set of data samples and comparing the reconstructed signal with the original signal, a determination can be made whether too few or too many samples have been discarded to allow an adequate reproduction. More will be said about this preferred method below.

In an alternative embodiment, the magnitude of each frequency component is examined to ascertain whether each frequency component is contributing in a significant manner to the representation of the input signal. Stated in other words, when the frequency components exceed a predetermined threshold level such as designated at L, the components are deemed signicant and a sufficient number of data samples should be preserved for reproducing the signal.

Say, for example, in FIG. 7A the highest frequency component above the predetermined threshold L is 4 F=240 Hz. In order to satisfy the Nyquist criterion, sampling must occur at a rate higher than 480 Hz, say, 640 samples per second. Accordingly, if 3840 samples per second have been taken, then one-sixth of this number, or 640 would suffice to satisfy the Nyquist criterion. It will therefore be appreciated that five out of each consecutive six samples can be discarded, while still providing an effective sampling rate of 640 Hz.

Figure 7B:
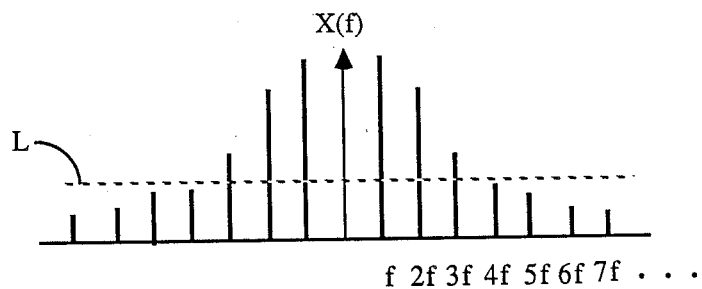

As a further example, in FIG. 7B it may be seen that the highest frequency of interest which exceeds the predetermined threshold level L is 3 F=180 Hz. Thus, the sampling must occur at a rate exceeding 360 Hz, say 480 Hz, in order to satisfy the Nyquist criterion. Of 3840 samples per second, then there are eight times as many samples as are required to reproduce 240 Hz components. Accordingly, the method involves only retaining one of every eight consecutive samples and discarding the other seven.

It will therefore be appreciated that one method of the present invention involves determining the highest frequency component in the input information signal which exceeds a predetermined threshold magnitude during a sampling period. This is accomplished in the alternative embodiment by employing a conventional FFT algorithm in the computer 50 to obtain the frequency components, and by then comparing each frequency component to a threshold until the highest frequency of interest above the threshold is identified. Then the set of n input data samples is decimated, leaving a set of a second predetermined number n reduced data samples.

In the example where there are n data samples (n being 3840 in the example discussed), there is provided a set of r ≤ n compressed data samples which are derived by decimating the predetermined number n data samples as a function of the highest frequency component present to obtain a second predetermined number r of data samples. It will of course be appreciated that the predetermined number r data samples remaining after decimation corresponds to the Nyquist criterion based on the highest frequency component present in the input signal. The frequency compression parameter provided is an indication of the highest frequency component in the set of compressed data samples.

In the preferred and alternative embodiments, the frequency compression parameter is a number which is related to the time period between successive ones of the predetermined number r of compressed data samples. This is illustrated in Table I.

Alternatively, where there are an integral number of samples such as 3840, the frequency compression parameter may signify an integral sequence of retained samples. For example, if the highest frequency of interest is 930 Hz, sampling should occur at no less than 1860 Hz in order to satisfy the Nyquist criterion. Inasmuch as 1920 Hz is sufficient to satisfy the criterion, and inasmuch as there are exactly twice this number of samples in the input set of n samples, then by discarding every other sample, there will be retained sufficient samples to reproduce 930 Hz. In this case, a frequency compression parameter of the integral number "two" signified that every other sample is discarded.

Continuing the integral example, if the highest frequency of interest is 180 Hz, then sampling should occur at a rate higher than 360 Hz. Since 480 Hz satisfies the criterion and provides an integral number of samples when divided into the sample set, 3840/480=8, the method of retaining one out of every eight consecutive samples and discarding the other seven may be signified by a frequency compression parameter of the integral number "eight". It will therefore be appreciated that this embodiment of the method of the present invention provides a frequency compression parameter corresponding to an integral sequence of retained samples. It will also be appreciated that in the example given, up to 32 harmonics of the 60 Hz fundamental may be represented by 3840 samples, so that the frequency code in this embodiment ranges from 1 to 32, thereby allowing a five-bit frequency compression parameter.

As in the case of gain ranging, the output data for the disclosed frequency ranging methods is provided as a stream of r data samples preceded by a frequency code word which signifies the time between data samples or the integral sequence of retained samples. Circuitry receiving the compressed data stream then can reconstruct the signal by converting the digital samples to analog form as a function of the frequency code (which in both embodiments described represents the time which it occured between the data samples being provided to the digital to analog converter).

It will be appreciated at this point that in the preferred embodiment gain ranging and frequency ranging are combined back-to-back in order to obtain a highly compressed data stream. For example, a set of $n_1$ data samples (where $n_1=60$) is processed to effectuate gain compression by the gain ranging circuit, and then these samples are accumulated by the frequency ranging circuit in RAM buffer 74 until $n_2$ samples have been acquired (where $n_2=3840$), whereafter the computer is responsive to effectuate frequency compression. The number of data samples ultimately transmitted may be provided as a function of the frequency components present in the input signal, while the scaling of the output samples is provided as a function of the highest gain excursion present in the input data samples. Therefore, in such a combination of methods there is provided a pair of code words preceding a set of r data samples, where r is less than the number n of input data samples, and where each data sample has k bits, where k is less than the number m of bits in each input data sample.

Figure 4:
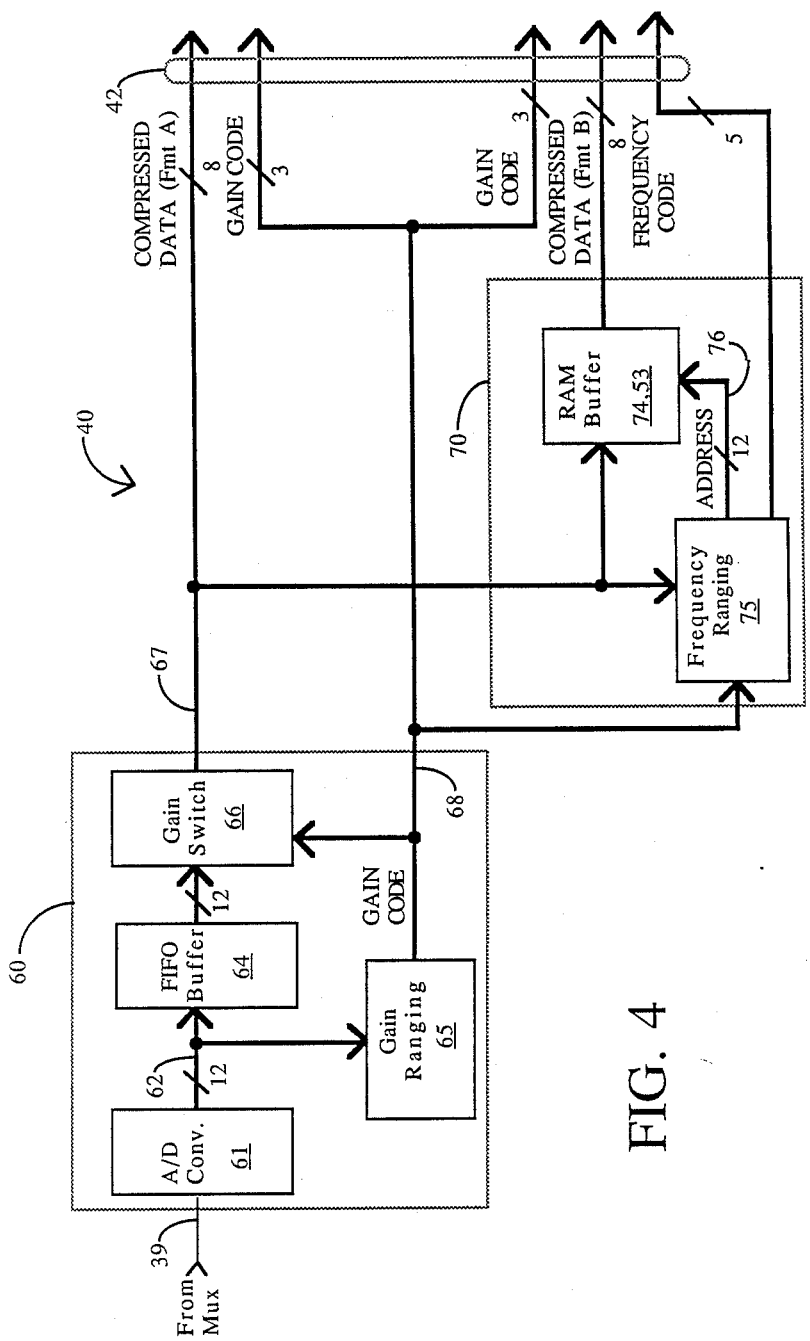
FIG. 4 is a block diagram of the data compression section illustrated in FIG. 2.

Returning now to FIG. 4, there will be described the preferred embodiment of the data compression circuit 40 which effectuates gain ranging and frequency ranging in the present invention. The data compression circuit 40 preferably comprises a gain compression subsection 60 and a frequency compression subsection 70. As discussed in connection with FIG. 2, analog samples of the input signals are provided on line 39 to the data compression circuit 40. This analog signal is provided first to the gain compression subsection 60, and particularly to a 12-bit analog to digital (A/D) converter 61 for conversion of the sample into a 12-bit digital word. These samples are then provided on lines 62 to a first-in-first-out (FIFO) buffer 64 and to a gain ranging circuit 65. The output of the first-in-first-out buffer 64 is provided to a gain switch 66 which selects a particular eight of the 12 bits of data to provide an eight-bit output word. The gain ranging circuit 65 is responsive to detect the greatest amplitude sample in a set of n input samples, and provide a three-bit GAIN CODE. on lines 67. Where gain compression is the only compression taking place, the output of the gain compression subsection 60 is an eight-bit word COMPRESSED DATA (Format A) on lines 67 and a three-bit GAIN CODE provided on lines 68. Collectively, these signals appear on lines 42.

As discussed earlier, in the preferred embodiment, gain ranging and frequency ranging are both provided. Accordingly, the eight-bit output of the gain switch 66 in the gain compression subsection 60 is provided to a frequency ranging subsection 70, and in particular to a random access memory (RAM) buffer 74 contained therein. Preferably, RAM buffer 74 is 4,096 eight-bit words for ease of addressing. The GAIN CODE on line 68 is also provided to the frequency ranging subsection 70, and in particular to a frequency ranging circuit 75. It will of course be understood by those skilled in the art that the GAIN CODE, which relates to the magnitudes of the input samples, is required by the FFT algorithm employed in the alternative embodiment in order to obtain the magnitude of the frequency components.

The output of the frequency ranging circuit 75 is a twelve-bit address provided on lines 76 to the RAM buffer 74. The addresses on lines 76 are used to select predetermined ones of the data samples stored in the RAM buffer so as to decimate the predetermined number n data samples to obtain the second predetermined number r of compressed data samples. Accordingly, it will be appreciated that the output of the frequency ranging circuit 70, which is the combination frequency and gain compressed data, is a three-bit GAIN CODE, a five-bit FREQUENCY CODE, and an eight-bit COMPRESSED DATA word, provided on lines 42.

In the preferred embodiment, frequency ranging is effectuated by a downward/upward decimation method. In this method, the input data samples are first decimation to remove samples, and after this "downwards" decimation, an "upwards" decimation or interpolation is performed in an effort to recreate or reconstruct the input signal from the decimated data samples. The reconstructed signal is then compared to the original input signal, on a point by point basis, employing conventional digital comparison techniques. If the input signal and the reconstructed signal compare within a predetermined error percentage, then it is established that the signal can be adequately reproduced at the other end of the communications channel or upon retrieval from storage. Accordingly, the compressed signal is then transmitted or stored in the described manner.

On the other hand, if the reconstructed signal does not match the original signal within the predetermined error percentage, it is indicated that too many data samples were removed. Accordingly, the downwards decimation process is repeated, removing fewer data samples. Then, the upwards decimation or interpolation process is repeated, and the resultant set of samples again used to reconstruct the input signal. The comparison to the input signal is repeated, and again a determination is made whether the reconstructed signal matches the input signal within a predetermined error percentage. These steps are repeated until the reconstructed signal matches the input signal within a predetermined error percentage.

It will be understood that the steps of comparing the original data with the reconstructed data merely comprises substraction operations by the computer, and comparison of the difference to a predetermined acceptable tolerance or error on a point by point basis. Programming the computer 50 in order to carry out such a method is within the skill of the art. Moreover, the predetermined acceptable tolerance is an operator settable parameter. Inasmuch as one primary object of the present invention is to be able to reconstruct the input signal for purposes of acceptable graphic display at the end of a communications link, those skilled in the art will understand that what is considered "acceptable" reproduction for graphic display may vary depending upon the personal preferences of the analyst or the exigencies of the moment. Thus, it will be appreciated that in this disclosed embodiment, one may trade off accuracy of the reconstructed signal for speed of compression, transmission, and decompression, in such circumstances as the operator may see fit, merely by changing the acceptable error tolerance.

It will still further be understood that while this preferred technique for insuring adequately faithful reproduction of the input signal requires additional processing time prior to transmission or storage, in applications such as power line fault analysis wherein the data is stored on site for a fault occurrence, compressed, and then either stored on a mass medium or transmitted, ample processor time will be available after occurrence of the fault since the likelihood of a series of faults occurring so quickly as to overflow memory is low.

In the alternative embodiment, frequency ranging is effectuated by employing a commercially available FFT program on the IBM PC 50. In such an embodiment, the eight-bit gain compressed data samples provided on lines 67 from the gain ranging circuit 60, plus the three-bit gain code on lines 68, are provided via the 488 bus control circuit 458 to the IBM PC CPU and stored in RAM 53 (FIG. 3). RAM 53 in FIG. 3 thus performs the function of RAM buffer 74 in FIG. 4.

It will be understood by those skilled in the art that FFT's are typically performed on sample sizes which are an even power of two, typically 1024, and that there is no relation to the number of input samples per second. Accordingly, it will be understood that the FFT algorithm must be able to compute rapidly enough to stay ahead of the input data stream if real time compression is desired. If off line computation is employed, then of course the speed of the FFT algorithm is not as crucial.

After a set of n gain-compressed samples have been acquired, the program in the IBM PC executes the FFT program to obtain the frequency components present in the samples. Then, the steps illustrated in FIG. 8 and described hereinbelow are executed to decimate the sample set to obtain a reduced set of r frequency-compressed samples. Thus, it will be understood that in the preferred embodiment there is not a frequency ranging "circuit" 75 in the strict sense of the word.

Both disclosed embodiments employ this "off line" or "software intensive" technique for frequency ranging primarily for economic reasons. Inasmuch as the downward/upward decimation algorithm is simple and fast, FFT software is readily available for the IBM PC, and there is ample time and sufficient memory in the disclosed embodiment to perform frequency ranging for frequencies of interest in power line fault analysis, it is not believed that resort to specialized hardware is needed in such applications. However, in applications requiring extremely rapid compression times, for example in seismic recording, it will be understood by those skilled in the art that a hardware implementation of the frequency ranging circuit 75 may be easily constructed using commercially available components. In particular, a conventional FFT circuit such as described in the article by Reidel et al. and entitled "A Signal Processing Implementation For An IMB-PC-Based Workstation", *IEEE MICRO*, Oct. 1985, pages 52–67, the disclosure of which is incorporated herein by reference and made a part hereof, may be employed to ascertain the frequency components in the set of data samples which have been gain compressed by the gain compression subsection 60. As will be understood by those skilled in the art, this circuit may be employed in conjunction with programming contained in the IBM PC to select predetermined ones of the data samples stored in the RAM buffer 74 (or RAM 53) to effectuate decimation and thereby obtain the set or r gain- and frequency-compressed data samples. Inasmuch as the skills required for programming the IBM PC and configuring the circuit described in the incorporated material are within the abilities of the skilled artisan, further discussion will not be provided herein.

Figure 5:
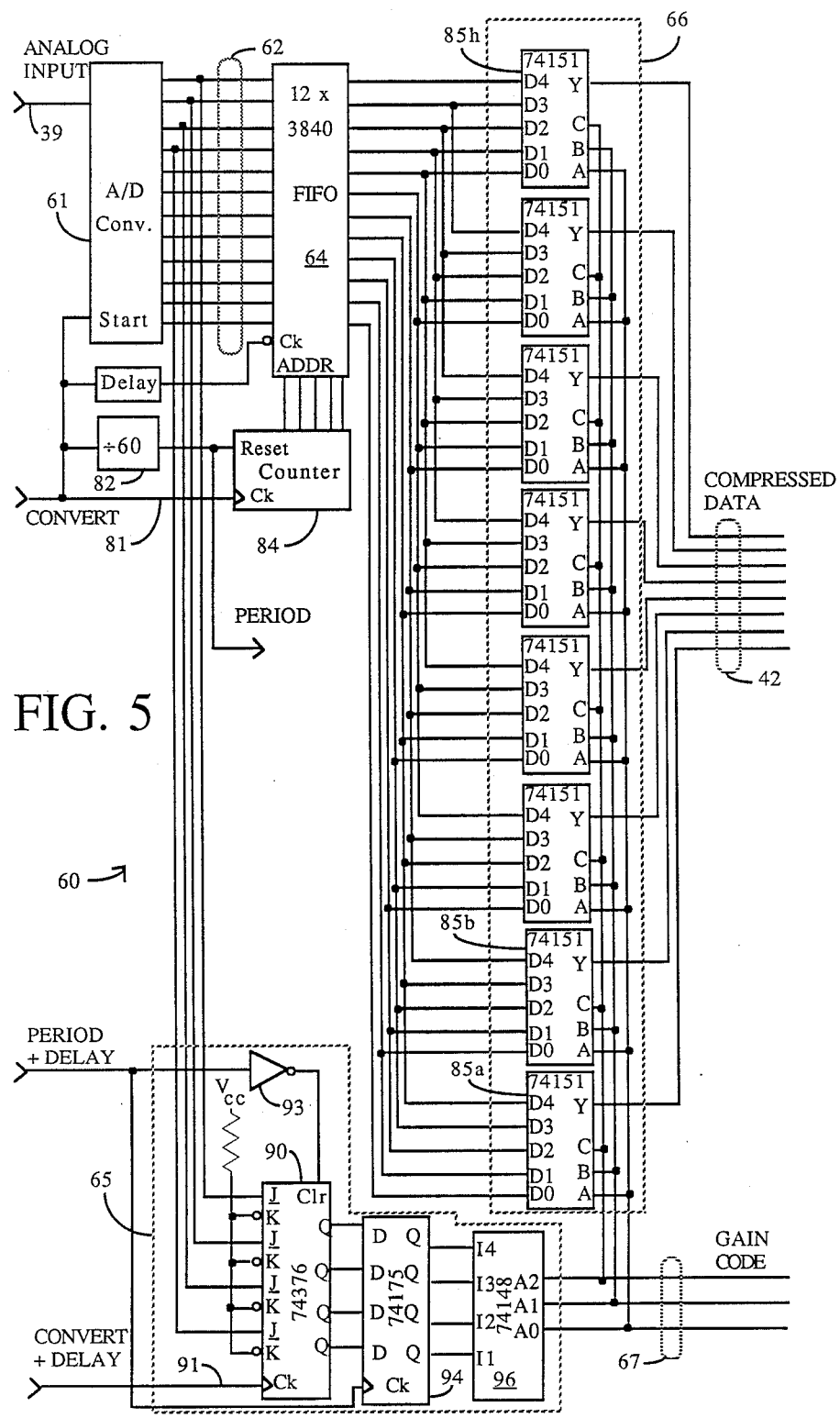
FIG. 5 is a detailed schematic diagram of a preferred embodiment of the gain ranging circuitry illustrated generally in FIG. 4.

FIG. 5 illustrates the gain compression subsection 60 (FIG. 4) in more detail. As shown therein, the analog input provided on line 39 is provided to a 12-bit A/D converter 61, the 12 outputs of which are provided on lines 62. In the preferred embodiment, a type ADC80-12 manufactured by Analog Devices, Norwood, Mass., is employed. The CONVERT input of the A/D converter 61 is connected to a signal labeled CONVERT on line 81 from a timing and control circuit (not illustrated). It will be understood that various timing and delay signals are required in construction of the preferred embodiment, the constructionof which will be within the skill of the art. In particular, the CONVERT signal should be provided on a periodic basis related to the sampling rate. As discussed hereinabove, the sampling rate in the preferred embodiment is 3840 Hz; accordingly, the CONVERT signal will occur at this rate.

The CONVERT signal is also provided to a divide-by-sixty circuit 82, the output of which provides a signal designated as PERIOD. The PERIOD signal signifies the end of a 60 sample set of data. It will be appreciated that the PERIOD signal will occur once for each set of 60 samples for the preferred embodiment. Recalling that the multiplexer 37 (FIG. 2) provides analog samples from four different inputs, it will be understood that the timing of the CONVERT and PERIOD signals must be altered for multiplexed arrangements, and that the circuit illustrated in FIG. 5 merely illustrates the circuit for use in a nonmultiplexed arrangement.

The PERIOD signal is provided to the reset input of a counter 84 which is used to address the FIFO memory 64. The CONVERT signal is provided to the clock input of the counter 84 for causing the counter to increment. Six bits of counter output are provided from the counter 84 to the address inputs of the FIFO 64.

The FIFO memory 64 in the preferred embodiment is a 12 bit by 60 word memory such as may be constructed by cascading five sets of three type 74ALS232 16×4 bit FIFO memories, manufactured by Texas Instruments. For a larger FIFO, a type DS2001 2 K×9 bit CMOS FIFO, manufactured by Dallas Semiconductor Corp., Dallas, Tex, may be employed.

The 12 bit outputs are provided to the gain switch 66, which comprises eight type 74151 data selectors/multiplexers 85a–85h manufactured by Texas Instruments. It will be observed in FIG. 5 that the inputs of the data selectors 85 are connected to receive five different ones of the 12 bits of digital data provided by the A/D converter 64 in an ascending manner. For example, the lowermost data selector 85a receives the five least significant bits of the output of the FIFO 64, while the data selector 85b receives the second through sixth least significant bits, and so on until the last data selector 85h receives the five most significant bits. Note further that the outputs Y of the data selectors 85a–85h provide the eight bit COMPRESSED DATA word. Selection between one of five bits provided to each of the data selectors is made by the three-bit GAIN CODE provided on lines 67.

The GAIN CODE is created by the gain ranging circuit 65 in the following manner. The four most significant bits from the A/D converter 61 are provided to the J input of a type 74376 J-$\overline{K}$ flip-flop. The $\overline{K}$ input is tied high. The clock input of the flip-flop 90 is connected to a signal denominated CONVERT+DELAY provided on line 91. This signal is provided from control circuitry (not illustrated) which essentially delays the CONVERT signal a predetermined amount of time to allow for propagation through the A/D converter 61. When this signal occurs, the flip-flop latches and holds the occurrence of any "one" occurring on a J input until cleared. Those skilled in the art will understand and appreciate that the J-$\overline{K}$ flip-flop 90, once a "one" has been clocked into the flip-flop, will hold the one until the flip-flop is cleared. The flip-flop is cleared by the signal denominated PERIOD+DELAY, which is provided through an inverter 93 to the clear ($\overline{CLR}$) input. This signal occurs after 60 samples have been converted and stored in the FIFO memory 64.

The Q outputs of the flip-flop 90 are provided to a type 74175 D-type flip-flop circuit 94 which latches the four bits of data from the flip-flop 90 on the signal PERIOD+DELAY. The flip-flop 94 holds the four bits of data from the J-$\overline{K}$ flip-flop 90 for use in formulating and holding the gain code while reading out the 60 samples of data from the FIFO memory 64.

The Q outputs of the flip-flop 94 are next provided to a type 74148 priority encoder 96 which converts the four bits of input data into a three-bit code denominated the GAIN CODE on line 67. The GAIN CODE is then connected to the select inputs A, B, C of the data selectors 85 and cause them to select one of five inputs received from the FIFO memory 64. The first word of data in the FIFO memory 64 reaches the outputs of the FIFO at the end of a sixty sample period. Accordingly, it will be appreciated that all sixty samples are clocked out of the FIFO 64 under the influence of the GAIN CODE formed during the sixty sample period. The data are then provided through the data selectors 85a–85h to form the eight bits of COMPRESSED DATA.

It will be appreciated that the circuitry described in FIG. 5 operates to provide a new GAIN CODE for every sixty samples. The gain ranging circuit 65 is responsive to each sample to determine the GAIN CODE for a set of 60 samples. At the end of a 60 sample set, when the PERIOD occurs, a new GAIN CODE is obtained and provided on line 67, and this value is held on line 67 as the previous 60 words in the FIFO are now in a position to be provided as outputs from the FIFO. It will of course be understood that the GAIN CODE remains as the samples are provided as outputs, while the J-$\overline{K}$ flip-flop 90 is responsive to the next set of samples being provided and stored therein.

It will also be understood that an embodiment consisting of randomly-addressed memories instead of a hardware FIFO can also be easily constructed and is within the skill of the art.

Figure 8:
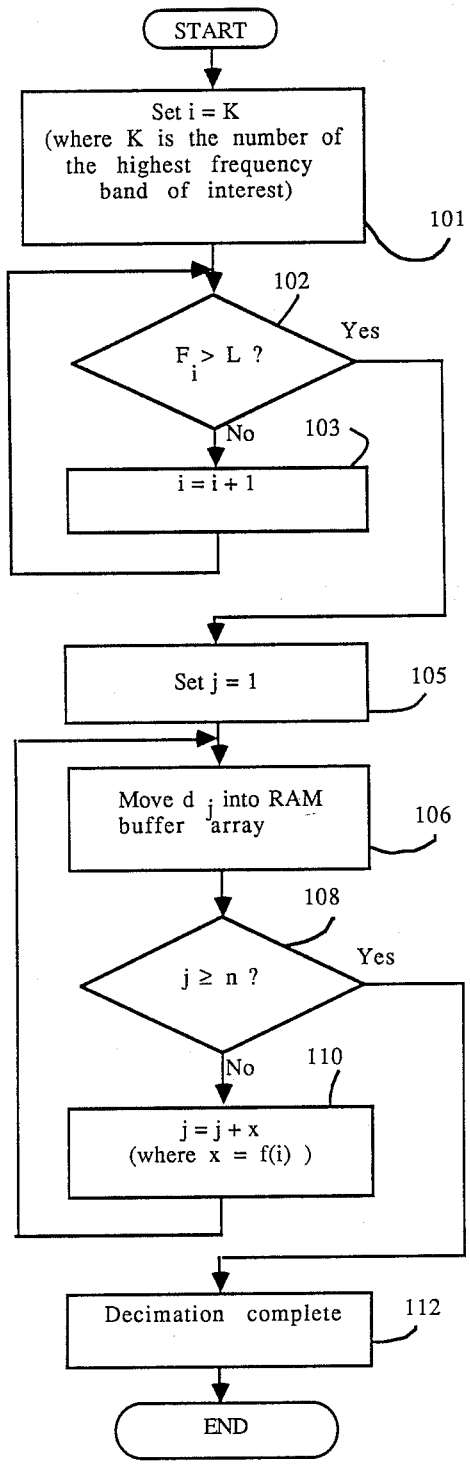
FIG. 8 is a flow chart diagram illustrating a preferred method of frequency compression performed by the present invention.

Turning to FIG. 8, next will be described the steps taken in the alternative embodiment for decimating the sample set of n input samples to obtain a set of r frequency-compressed samples. Prior to entry into the steps shown in FIG. 8, it will be understood that Fourier analysis by way of an FFT or other frequency analysis algorithm has been performed on the set of n data samples. Thus, upon entry into the routine, there will be provided a set of data values which correspond to the magnitudes of the harmonics of the input signal during the portion of the input signal represented by the set of n data samples. It will be appreciated that these steps are taken by the data compression circuit 40, and in particularly by the computer 50 in the control section 22, in conjunction with other computer programs employed for controlling the overall operation of the recorder.

Starting first at step 101 in FIG. 8, the first operation conducted is to set an index i equal to a number which corresponds to the highest frequency band of interest. For example, in the preferred embodiment up to 32 harmonics of the 60 Hz fundamental frequency can be represented within the Nyquist criterion with 3840 samples. Thus, in the preferred embodiment, i will be set to 14, which corresponds to the 32nd harmonic. Table II illustrates the relationship between the index i and the harmonics.

At step 102, the highest frequency of interest is compared to a predetermined threshold magnitude level L to determine whether there are any significant components at the frequency $F_i$. It will be appreciated that the comparison to the threshold L begins at the highest harmonic and works downwardly, so that the presence of a significant frequency component at the highest harmonic will be detected. In the event that the frequency of interest $F_i$ does not exceed the threshold level, the "no" branch from 102 is taken to step 103, and the index i is increased by one. The first harmonic to be detected above the threshold level L causes the "yes" branch to be taken from 102 to step 105.

At step 105, an index j is initialized to one, preparatory to moving a data sample $d_j$ into memory. Then, at step 106 the data sample $d_j$ is moved into a location in the RAM buffer 74, or alternatively in the RAM 53, which has been set aside specifically for post-decimation data. Next, at 108, the index j is compared to the total number of samples n, where n is the total number of samples in the set being processed, the number being 3840 in the preferred embodiment and 1024 in the embodiment employing an FFT algorithm. If the pointer j has not passed n then the "no" branch is taken to step 110, where the pointer j is incremented by a predetermined number x. The predetermined number x is an incremental amount which is determined as a function of the number i determined at step 102.

Referring to Table II, it will be observed that the predetermined number x generally increases as i decreases. Preferably, and as has been discussed earlier herein, the incremental amount x is an integral divisor of 3840, so that there are no fractional increments for j. Having integral increments results in the ability to discard particular integral numbers of samples rather than fractional numbers, which would complicate the selection of samples. Thus, Table II represents the situation wherein x is an integer.

After step 110 and j is incremented, the program returns to step 106, and the next data sample is moved into a memory.

When j equals or exceeds n, then the "yes" branch is taken from step 108, and the decimation process is complete. The decimated data samples will now be present in the RAM buffer array, and the data will be ready for transmission or storage together with an associated frequency code which is also a function of i.

Another novel and useful function performed in the preferred embodiment in determining whether significant information has been lost in the compressed signal. In other words, there may be circumstances wherein the data compression techniques remove so much information from the input data that a faithful reproduction of the signal is not possible. Those skilled in the art will understand that of the two basic data compression categories, redundancy reduction and entropy reduction, only entropy reduction results in a loss of information. If the entropy of an information signal is reduced beyond a certain point, the information is irretrievably lost. Those skilled in the art will appreciate that the frequency compression technique described herein is an entropy reduction method in that information corresponding to frequency bandwidths above a selected frequency of interest are discarded by reducing the sampling rate. This information is irretrievably lost.

Accordingly, in the alternative embodiment employing the FFT algorithm, the above-described method of the preferred embodiment for reconstructing the input signal from the decimated data set prior to transmission or storage may be employed to determine whether the input signal can be adequately reproduced. Essentially, the steps taken involve performing an inverse operation within the system to recreate the input signal after decimation but prior to transmission or storage of the compressed data. The reconstructed signal is then compared to the original signal. If the signals compare within a predetermined error percentage, then it is established that the signal can be adequately reproduced at the end of the communications channel or upon retrieval from storage. Accordingly, the compressed signal is then transmitted or stored in the described manner.

On the other hand, if the reconstructed signal does not match the original signal within the predetermined error percentage, an additional harmonic is added, thereby increasing the effective sampling rate and discarding fewer samples. The process is repeated until the original signal can be reconstructed within a predetermined tolerance. It will of course be appreciated that, as described above in connection with the preferred embodiment, the steps of comparing the original data to the reconstructed data merely comprises subtraction operations by the computer and comparison of the difference to a predetermined acceptable difference on a point by point basis.

In the playback unit 12 (FIG. 1), the technique for deriving a reconstructed signal received over the telephone line or retrieved from a mass storage medium is simply the inverse of the gain or frequency ranging. The playback unit reads each eight bit word of data which is provided as a sample and places the set of samples in a temporary buffer. Each of these samples is then multiplied by the gain code provided as the first word accompanying the set of data. For example, if the two least significant bits and the two most significant bits were discarded, this would correspond to a multiplication by four. Secondly, the frequency code is employed to determine the time between consecutive samples. After the playback unit finishes reconstructing the data, the data is printed out on a printer to obtain an actual graphic plot of the fault, or is displayed on a CRT for analysis.

Figure 9:
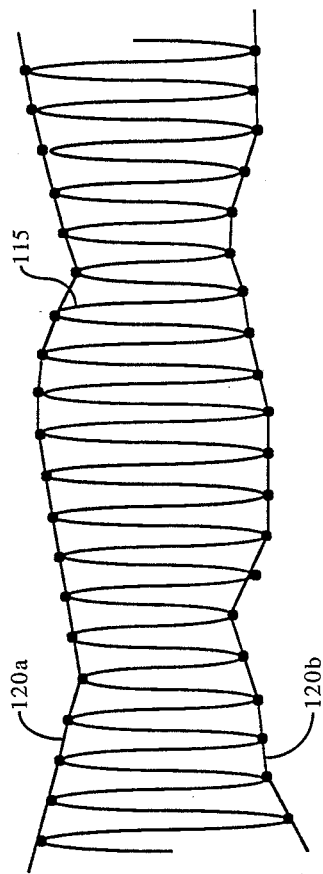
FIG. 9 illustrates an exemplary waveform and envelope, the data representative of which are compressed and displayed with the preferred embodiment of the present invention.

Turning next to FIG. 9, there is illustrated a typical 60 Hz signal waveform 115 and its associated envelope 120a, 120b. As may be seen in this figure, the envelope line 120a comprises a line drawn through the positive peaks of the waveform 115, while the envelope 120b comprises a line drawn through the negative peaks of the waveform 115. While the figure shown in this figure is somewhat exaggerated for clarity, it will be understood by those skilled in the art that the envelope lines 120a, 120b, since they require only one sample at the positive and negative peak of each complete cycle of the waveform 115, can be used to reproduce the envelope of the signal over an extended period of time without requiring that large quantities of data be stored and/or transmitted.

Figure 10:
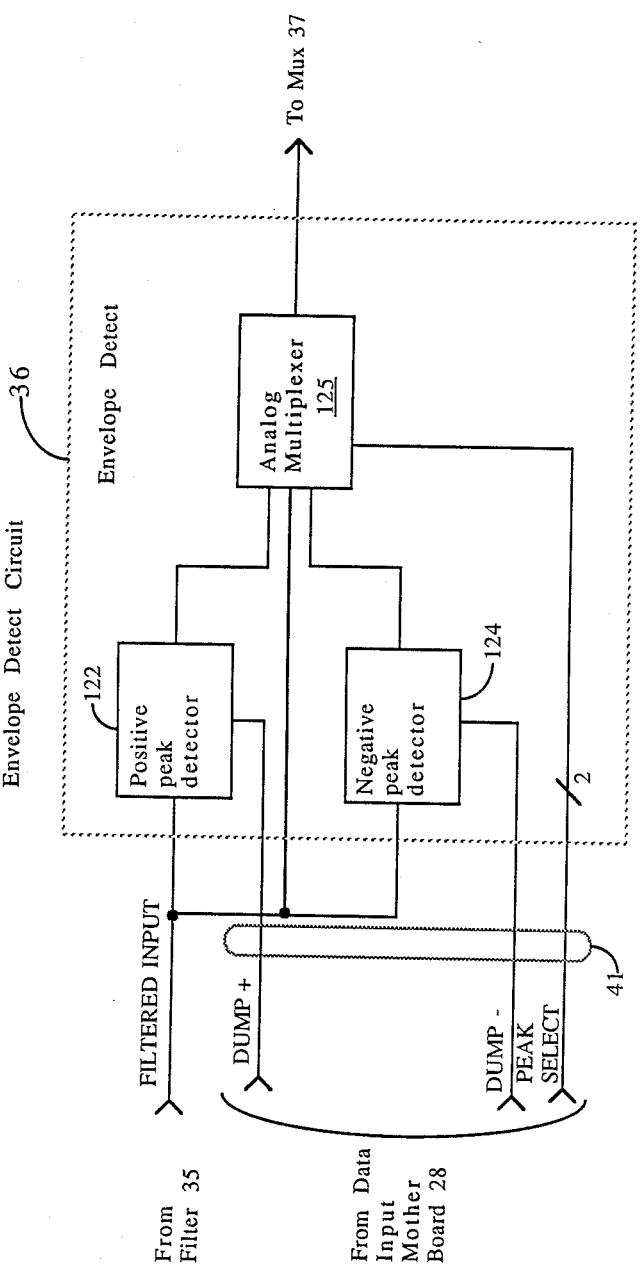
FIG. 10 is a detailed schematic diagram of the envelope detection circuitry employed in the preferred embodiment illustrated in FIG. 2.

FIG. 10 illustrates the envelope detect circuit 36 (FIG. 2) in more detail. The envelope detect circuit 36 receives a signal denominated FILTERED INPUT from the filter 35 (FIG. 2) and provides an analog output to the multiplexer 37. The envelope detect circuit comprises a positive peak detector 122 and a negative peak detector 124, both connected to receive the FILTERED INPUT signal. The outputs of the positive peak detector 122 and the negative peak detector 124, as well as the FILTERED INPUT signal itself, are provided as inputs to an analog multiplexer 125. The analog multiplexer 125 allows selection between signals representing the positive peak, the negative peak, and the waveform itself. Multiplexer 125 in the preferred embodiment is a conventional analog multiplexer such as a type CD4052 differential four-channel analog multiplexer/demultiplexer, manufactured by RCA Corporation, Somerville, N.J. The positive peak detector 122 and negative peak detector 124 are conventional analog peak detectors, the construction of which will be known to those skilled in the art. Each of the peak detectors 122, 124 receives a control signal, denominated DUMP+ and DUMP−, respectively, which reset the peak detector circuits for detection of a new peak. The peak detector circuits each hold the peak value of signal seen at its input until receipt of its respective DUMP signal.

The control signal lines 41 for the envelope detect circuit originate from the data input mother board 28 (FIG. 2). The envelope control lines 41 comprise the DUMP+ signal, the DUMP− signal, and two PEAK SELECT signal lines. The two PEAK SELECT signals are used to control the selection of which input signal to multiplexer 125 will be seen on the output and thus provided to multiplexer 37. It will therefore be appreciated that the PEAK SELECT signals are the input select signals for multiplexer 125.

It will further be understood that the envelope control lines 41 ultimately originate with the computer IBM PC CPU 50, so that the envelope detect circuits can operate under program control. Accordingly, it will be understood that operation of the envelope detect circuit 36 in the normal mode requires selection of the FILTERED INPUT signal at the 3840 sample per second rate. Correspondingly, there is less frequent selection of the signals being provided from the positive peak detector 122 and the negative peak detector 124, which it will be recalled occur at 120 samples per second in the envelope mode. It is considered within the skill of the art to program the computer 50 to cause the selection of signals in the envelope detect circuit 36 for each channel in the preferred embodiment of the data input section 20, for operation in the normal mode, for operation in the envelope mode, or for operation in a combined mode wherein envelope data are obtained on a time division multiplexed basis.

Data which has been processed by the envelope detect circuit 36 is then provided to the multiplexer 37 and to the data compression circuit 40 in the manner as described above, for compression in the manner described above. It should be understood, however, that the data compression circuit 40 is operative to compress all data being provided to it, whether originating as the FILTERED INPUT signal which are used to reproduce the waveform itself, or whether originating as signals from the outputs of the positive peak detector 122 and negative peak detector 124.

Display of the decompressed data when operating in the envelope mode comprises tracing of the waveform envelope over time utilizing the sampled peak data for plotting the waveform envelope. An exemplary plot of course is shown in FIG. 9. It is also considered within the skill of the art to program the computer 15 in the playback unit 12 to graphically plot the decompressed data samples representing the peaks envelope, by tracing an envelope line such as illustrated at 120a, 120b in FIG. 9. The waveform envelope is preferably plotted by taking each of the positive and negative peaks and plotting a straight line between the present peak and the previous peak. In the preferred embodiment, no curve fitting or interpolation is attempted, although it will be appreciated that if the time scale or amplitude scale is expanded sufficiently, it may be desirable to do curve fitting or interpolation. The resulting display in the preferred embodiment is as appears in FIG. 9, with an outline of the waveform envelope plotted simultaneously with an outline of the signal itself. The amplitude and time scale of the display can be manipulated to expand or contract particular portions of the waveform under investigation by scaling of the data with appropriate routines in the program for the computer 15.

It will be recalled that the preferred embodiment comprises circuitry for sampling data for a plurality of input channels. In such an embodiment, it is preferred that all channels be sampled in a burst to minimize interchannel time skew. Accordingly, after the input conditioning circuits (i.e., input scaling circuit 32, isolation amplifier 34, and filter 35) have damped any initial transients, the positive and negative peaks are alternately sampled at 120 Hz sample rate. All positive peaks are sampled in a 260 μS time period and then reset with the DUMP+ signal to capture the next peak. Then, 8.33 mS later, all the negative peaks are sampled, again in a 260 μS time period, and reset with the DUMP− signal for the next negative peak. The positive peaks are sampled again 8.33 mS after the negative peaks. In this manner, both the positive and negative peak detect circuits 122, 124 operate at a full cycle of 60 Hz over which to acquire the peaks. Since the peak detectors will always be reset after being sampled, the preferred embodiment will also work for DC waveforms.

Finally, it will be understood that the computer 50 comprises control means which allow selection of the sampling periods for both the waveform itself and of the peaks of the waveform, as well as the numbers of samples to be accumulated in a set which is compressed by the data compression circuit 40. These data sets are compressed in the manner described above by the gain compression subsection 60, and a compression parameter corresponding to the greatest magnitude of the peaks in the set of samples corresponding to the peak data during the sampling period are provided.

It should be understood that the present invention contemplates at least two separate methods of combining the peaks data (which are accumulated at a relatively low sample rate) with the data representative of the waveform itself. In one method, the peak detect circuits are not required. Rather, a separate one of the m bit data samples is provided for representing the positive and negative peaks. Inasmuch as the magnitudes of the positive and negative peaks are determinative of the selection of a gain code, it will be understood that of each set of n samples processed at the higher sampling rate, there will be at least one sample in the set which represents the highest or greatest magnitude during that set of n data values. Thus, in this particular method, the single greatest peak signal within the set of n samples can be employed as the peak sample to be used for reconstructing the envelope. It will thus be appreciated that the present invention does not require peak detectors for reconstruction of an envelope.

In the preferred method, however, the positive and negative peak detect circuits are employed, whereas such circuits can be eliminated in the previously described method. In the preferred method, separate memory locations of the computer 50 are provided for accumulating data representative of the positive and negative peaks. These data are accumulated in the same manner as described above for the data representative of the waveform itself, analyzed for selection of a gain code, and compressed in the manner described above for the waveform data. This results in the provision of a separate stream of data comprising a gain word including a gain code, followed by the n data samples which have the reduced bit length. Thus, it will be understood that with the two separate approaches described, performing gain compression on the data samples represented above the peaks is optional. Those skilled in the art may realize that other methods and devices for reconstructing the waveform envelope can be implemented so as to realize the benefits of the waveform trend analysis capabilities of the present invention.

The preferred embodiments of the present invention have been disclosed by way of example and it will be understood that other modifications may occur to those skilled in the art without departing from the scope and the spirit of the appended claims.

What is claimed is:

1. An electrical power line waveform envelope monitoring and display apparatus, comprising:
   means connectable to an electrical power line for sampling signals representative of the peaks of waveforms occurring on said electrical power line and for providing a plurality of digital samples;
   means for compressing said plurality of digital samples and for providing a compressed data set for transmission over a communication link;
   means for transmitting said compressed data set over said communication link;
   means for decompressing said compressed data set after transmission over said communication link and for providing a plurality of decompressed digital samples; and
   means for displaying an envelope waveform reconstructed from said decompressed digital samples corresponding to the envelope of signals occurring on said electrical power line.

2. The apparatus of claim 1, wherein said displaying means comprises means for plotting a graphical representation of the peaks envelope of said signals occurring on said electrical power line.

3. The apparatus of claim 2, further comprising means for manipulating the time scale and amplitude of the plotted graphical representation of the peaks envelope.

4. An electrical power line monitoring and display apparatus, comprising:
   first sampling means for sampling signals representative of waveforms occurring on an electrical power line and for providing a first sample set;
   second sampling means for sampling signals representative of the peaks of waveforms occurring on said electrical power line and for providing a second sample set;
   means for compressing said first and said second sample sets to obtain a compressed data set;
   means for transmitting said compressed data set over a communication link;
   means for decompressing said compressed data set after transmission over said communication link and for providing a decompressed first sample set and a decompressed second sample set; and
   means for displaying a composite waveform corresponding to said signals occurring on said electrical power line reconstructed from said decompressed data, said composite waveform comprising a reconstructed waveform signal and an envelope for said waveform signal.

5. The apparatus of claim 4, wherein said displaying means comprises means for plotting a graphical representation of the peaks envelope of said signals occurring on said electrical power line.

6. The apparatus of claim 5, further comprising means for manipulating the time scale and amplitude of the plotted graphical representation of the peaks envelope.

7. The apparatus of claim 4, wherein said first sampling means and said second sampling means comprises a single sampling means, said single sampling means being operative to sample signals representative of waveforms occurring on said electrical power line at a first sampling rate for providing said first sample set, and further being operative to sample signals representative of the peaks of waveforms occurring on said electrical power line at a second sampling rate for providing said second sample set, said first sampling rate being greater than said second sampling rate.

8. The apparatus of claim 4, wherein said second sampling means comprises positive peak detector means for detecting the positive peak excursion of waveforms occurring on said electrical power line, and negative peak detector means for detecting the negative peak excursion of waveforms occurring on said electrical power line.

9. The apparatus of claim 4, wherein said first sampling means and said second sampling means comprises:
   input means for providing input information signals obtained from an electrical power transmission line;
   positive peak detector means for detecting the positive peak excursion of waveforms provided from said input means;
   negative peak detector means for detecting the negative peak excursion of waveforms provided from said input means;
   multiplexer means for multiplexing signals from said positive peak detector means, said negative peak detector means, and said input means; and
   analog to digital (A/D) converter means for converting signals from said multiplexer means into digital signals corresponding to said first sample set and said second sample set.

10. The apparatus of claim 9, wherein said input means comprises a high impedance input buffer amplifier and a bandpass filter.

11. An electrical power line data recorder/monitor apparatus, comprising;
   input means for conditioning input information signals obtained from an electrical power transmission line;
   envelope detection means for detecting the boundaries of said input information signals during a first sampling period;
   data compression means for providing a compressed data string comprising a compression parameter, a predetermined number $r_1$ of data samples representing the boundaries of said input information signals during said first sampling period, and a predetermined number $r_2$ of data samples representing said input information signals during a second sampling period; and
   memory means for accumulating said compressed data string for display or transmission to a remote site.

12. The apparatus of claim 11, wherein said apparatus includes a plurality of channels for providing a plurality of input information signals, and wherein each of said channels includes a dedicated envelope detection means, and further comprising multiplexer means operatively connected to said compression means for multiplexing said plurality of channels of input information signals.

13. The apparatus of claim 11, further comprising control means for controlling the selection of said first sampling period, said second sampling period, the values of said predetermined numbers $r_1$ and $r_2$, and said compression parameter.

14. The apparatus of claim 11, wherein said first sampling period is relatively long when compared to said second sampling period.

15. The apparatus of claim 11, wherein said data compression means comprises:
   analog to digital (A/D) conversion means for converting said input information signal into digital signals;
   first in first out (FIFO) buffer means for storing said digital signals;
   gain ranging means responsive to the magnitudes of said digital signals for providing a compression parameter corresponding to the greatest magnitude of said digital signals during said sampling period;
   gain switch means responsive to said compression parameter for selecting a predetermined range of bits of each one of said digital signals; and
   output means for providing as said compressed data string said compression parameter and said predetermined range of bits of each of said digital signals from said FIFO means.

16. The apparatus of claim 11, further comprising display means responsive to said compressed data string for displaying a graphical representation of said input information signal and its envelope.

17. The apparatus of claim 16, wherein said display means is located at a remote site from said recorder/monitor apparatus, and further comprising data transmission means associated with said recorder/monitor apparatus for transmitting said compressed data string from the site of said recorder/monitor to the site of said display means.

18. Apparatus for compression of an input information signal, comprising:
   input means for receiving an input information having a bandwidth B;
   envelope detection means for sampling said input information signal during a first sampling period at a first sampling frequency f, where f is a frequency less than B, and for providing a first predetermined number $n_1$ of envelope data samples representing the boundaries of said input information signal during said first sampling period;
   means for providing a second predetermined number $n_2$ of input data samples representing said input information signal during a second sampling period;
   signal processing means responsive to said first and said second predetermined numbers $n_1$ and $n_2$ of samples for determining a compression parameter corresponding to the magnitude of an information parameter of said input information signal;
   compression means responsive to said compression parameter for selecting a predetermined portion of said data samples to provide a predetermined number $r_1$ of compressed envelope data samples and a predetermined number $r_2$ of compressed signal data samples; and
   output means for providing a compressed data string comprising said compression parameter, said predetermined number $r_1$ compressed envelope data samples, and said predetermined number $r_2$ compressed signal data samples.

19. The apparatus of claim 18, wherein said first sampling period is relatively long when compared to said second sampling period.

20. The apparatus of claim 19, wherein the apparatus is employed in a 60 Hz electrical power line fault recorder, and wherein said first sampling period is about 8.33 mS, and wherein said second sampling period is about 260 μS.

21. The apparatus of claim 18, wherein said envelope detection means comprises:
   positive peak detector means for detecting the positive peak excursion of said input information signal, and negative peak detector means for detecting the negative peak excursion of said input information signal.

22. The apparatus of claim 18, further comprising means responsive said envelope detection means for plotting a graphical representation of the peak envelope of said input information signal.

23. The apparatus of claim 22, further comprising means for manipulating the time scale and amplitude of the plotted graphical representation of the peak envelope.

24. In or for a digital data recorder, an apparatus for obtaining and displaying data representative of an input information signal and the waveform trend of said input information signal, comprising:
   means for sampling said input information signal during a first sampling period to provide a set of first data samples;
   second sampling means for sampling the input information signal during a second sampling period, said second sampling period being a predetermined amount of time greater than said first sampling period;
   positive peak detector means for detecting the positive peak excursion of said input information signal provided by said second sampling means during said second sampling period and for providing a positive peak signal;
   negative peak detector means for detecting the negative peak excursion of said input information signal provided by said second sampling means during said second sampling period and for providing a negative peak signal;
   means for resetting said positive and said negative peak detectors after the expiration of said second sampling period;
   compression means for providing a compressed data string comprising a compression parameter, a first set of digital data samples representative of compressed values of said set of first data samples, and a second set of digital data samples representative of compressed values of said positive peak signal and said negative peak signal;
   means for transmitting said compressed data string over a communication link;
   decompression means responsive to said compressed data string upon receipt over said communication link for providing a reproduced version of said first data samples, said positive peak signal, and said negative peak signal; and
   display means for displaying said reproduced version of said input information signal derived from said first data samples, said positive peak signal, and said negative peak signal, with said positive peak signal and said negative peak signal being displayed as an envelope of the reproduced version of said input information signal.

25. Method for compression of an input information signal, comprising the steps of:
   receiving an input information having a bandwidth B;
   sampling said input information signal during a first sampling period at a first sampling frequency f, where f is a frequency less than B, and providing a first predetermined number $n_1$ of envelope data samples representing the boundaries of said input information signal during said first sampling period;
   providing a second predetermined number $n_2$ of input data samples representing said input information signal during a second sampling period;
   determining a compression parameter corresponding to the magnitude of an information parameter of said input information signal;
   selecting a predetermined portion of said envelope data samples and said input data samples to provide a predetermined number $r_1$ of compressed envelope data samples and a predetermined number $r_2$ of compressed signal data samples; and
   providing a compressed data string comprising said compression parameter, said predetermined number $r_1$ compressed envelope data samples, and said predetermined number $r_2$ compressed signal data samples.

26. The method of claim 25, wherein said compression parameter comprises a gain code corresponding to a gain factor applicable to said predetermined number $r_1$ compressed envelope data samples or said predetermined number $r_2$ compressed signal data samples.

27. A method for monitoring and displaying a fault on an electrical power line, comprising the steps of:
   sampling signals representative of waveforms occurring on the electrical power line and providing a first sample set;
   sampling signals representative of the peaks of waveforms occurring on said electrical power line and providing a second sample set;
   compressing said first and said second sample sets to obtain a compressed data set;
   transmitting said compressed data set over a communication link;
   decompressing said compressed data set after transmission over said communication link and providing a decompressed first sample set and a decompressed second sample set; and
   displaying a composite waveform derived from said decompressed first sample set and said decompressed second sample set, said composite waveform comprising a reconstructed waveform signal and an envelope for said waveform signal.

28. In or for a digital data recorder, a method for obtaining and displaying data representative of an input information signal and the waveform trend of said input information signal, comprising the steps of:
   sampling the input information signal during a first sampling period to provide a set of first data samples;
   sampling the input information signal during a second sampling period, said second sampling period being a predetermined amount of time greater than said first sampling period;
   detecting the positive peak excursion of the input information signal during the second sampling period and providing a positive peak signal;
   detecting the negative peak excursion of said input information signal during the second sampling period and providing a negative peak signal;
   determining a compression parameter for the set of first data samples and for the peak signals;
   providing a compressed data string comprising the compression parameter, a first set of digital data samples representative of compressed values of said set of first data samples, and a second set of digital data samples representative of compressed values of said positive peak signal and said negative peak signal;
   transmitting said compressed data string over a communication link;

decompressing said compressed data string upon receipt over said communication link to provide a reproduced version of said first data samples, said positive peak signal, and said negative peak signal; and displaying said reproduced version of said input information signal derived from said first data samples, said positive peak signal, and said negative peak signal, with said positive peak signal and said negative peak signal being displayed as an envelope of the reproduced version of said input information signal.

29. The method of claim 28, wherein said compression parameter is a gain code.

30. The apparatus of claim 11, wherein said compression parameter comprises a gain code corresponding to a gain factor applicable to said predetermined number $r_1$ of data samples or said predetermined number $r_2$ of signal data samples.

31. The apparatus of claim 18, wherein said compression parameter comprises a gain code corresponding to a gain factor applicable to said predetermined number $r_1$ compressed envelope data samples or said predetermined number $r_2$ compressed signal data samples.

32. An electrical power line waveform envelope monitoring and display apparatus, comprising:
means connectable to an electrical power line for sampling signals representative of the peaks of waveforms occurring on said electrical power line and for providing a plurality of digital samples;
means for compressing said plurality of digital samples and for providing a compressed data set for storage on a storage medium;
means for storing said compressed data set on said storage medium;
means for decompressing said compressed data set after recall from said storage medium and for providing a plurality of decompressed digital samples; and
means for displaying an envelope waveform reconstructed from said decompressed digital samples corresponding to the envelope of signals occurring on said electrical power line.

33. The apparatus of claim 32, wherein said displaying means comprises means for plotting a graphical representation of the peaks envelope of said signals occurring on said electrical power line.

34. The apparatus of claim 33, further comprising means for manipulating the time scale and amplitude of the plotted graphical representation of the peaks envelope.

35. An electrical power line monitoring and display apparatus, comprising:
first sampling means for sampling signals representative of waveforms occurring on an electrical power line and for providing a first sample set;
second sampling means for sampling signals representative of the peaks of waveforms occurring on said electrical power line and for providing a second sample set;
means for compressing said first and said second sample sets to obtain a compressed data set;
means for storing said compressed data set on a storage medium;
means for decompressing said compressed data set after or recall from said storage medium and for providing a decompressed first sample set and a decompressed second sample set; and means for displaying a composite waveform corresponding to said signals occurring on said electrical power line reconstructed from said decompressed data, said composite waveform comprising a reconstructed waveform signal and an envelope for said waveform signal.

36. The apparatus of claim 35, wherein said displaying means comprises means for plotting a graphical representation of the peaks envelope of said signals occurring on said electrical power line.

37. The apparatus of claim 36, further comprising means for manipulating the time scale and amplitude of the plotted graphical representation of the peaks envelope.

38. The apparatus of claim 35, wherein said first sampling means and said second sampling means comprises a single sampling means, said single sampling means being operative to sample signals representative of waveforms occurring on said electrical power line at a first sampling rate for providing said first sample set, and further being operative to sample signals representative of the peaks of waveforms occurring on said electrical power line at a second sampling rate for providing said second sample set, said first sampling rate being greater than said second sampling rate.

39. The apparatus of claim 35, wherein said second sampling means comprises positive peak detector means for detecting the positive peak excursion of waveforms occurring on said electrical power line, and negative peak detector means for detecting the negative peak excursion of waveforms occurring on said electrical power line.

40. The apparatus of claim 35, wherein said first sampling means and said second sampling means comprises:
input means for providing input information signals obtained from an electrical power transmission line;
positive peak detector means for detecting the positive peak excursion of waveforms provided from said input means;
negative peak detector means for detecting the negative peak excursion of waveforms provided from said input means;
multiplexer means for multiplexing signals from said positive peak detector means, said negative peak detector means, and said input means; and
analog to digital (A/D) converter means for converting signals from said multiplexer means into digital signals corresponding to said first sample set and said second sample set.

41. The apparatus of claim 40, wherein said input means comprises a high impedance input buffer amplifier and a bandpass filter.

42. In or for a digital data recorder, an apparatus for obtaining and displaying data representative of an input information signal and the waveform trend of said input information signal, comprising:
means for sampling said input information signal during a first sampling period to provide a set of first data samples;
second sampling means for sampling the input information signal during a second sampling period, said second sampling period being a predetermined amount of time greater than said first sampling period;
positive peak detector means for detecting the positive peak excursion of said input information signal provided by said second sampling means during said second sampling period and for providing a positive peak signal;

negative peak detector means for detecting the negative peak excursion of said input information signal provided by said second sampling means during said second sampling period and for providing a negative peak signal;

means for resetting said positive and said negative peak detectors after the expiration of said second sampling period;

compression means for providing a compressed data string comprising a compression parameter, a first set of digital data samples representative of compressed values of said set of first data samples, and a second set of digital data samples representative of compressed values of said positive peak signal and said negative peak signal;

means for storing said compressed data string on a storage medium;

decompression means responsive to said compressed data string upon recall from said storage medium for providing a reproduced version of said first data samples, said positive peak signal, and said negative peak signal; and display means for displaying said reproduced version of said input information signal derived from said first data samples, said positive peak signal, and said negative peak signal, with said positive peak signal and said negative peak signal being displayed as an envelope of the reproduced version of said input information signal.

43. A method for monitoring and displaying a fault on an electrical power line, comprising the steps of:
sampling signals representative of waveforms occurring on the electrical power line and providing a first sample set;
sampling signals representative of the peaks of waveforms occurring on said electrical power line and providing a second sample set;
compressing said first and said second sample sets to obtain a compressed data set;
storing said compressed data on a storage medium;
decompressing said compressed data set after recall from said storage medium and providing a decompressed first sample set and a decompressed second sample set; and
displaying a composite waveform derived from said decompressed first sample set and said decompressed second sample set, said composite waveform comprising a reconstructed waveform signal and an envelope for said waveform signal.

44. In or for a digital data recorder, a method for obtaining and displaying data representative of an input information signal and the waveform trend of said input information signal, comprising the steps of:
sampling the input information signal during a first sampling period to provide a set of first data samples;
sampling the input information signal during a second sampling period, said second sampling period being a predetermined amount of time greater than said first sampling period;
detecting the positive peak excursion of the input information signal during the second sampling period and providing a positive peak signal;
detecting the negative peak excursion of said input information signal during the second sampling period and providing a negative peak signal;
determining a compression parameter for the set of first data samples and for the peak signals;
providing a compressed data string comprising the compression parameter, a first set of digital data samples representative of compressed values of said set of first data samples, and a second set of digital data samples representative of compressed values of said positive peak signal and said negative peak signal;
storing said compressed data string on a storage medium;
decompressing said compressed data string upon recall from said storage medium to provide a reproduced version of said first data samples, said positive peak signal, and said negative peak signal; and
displaying said reproduced version of said input information signal derived from said first data samples, said positive peak signal, and said negative peak signal, with said positive peak signal and said negative peak signal being displayed as an envelope of the reproduced version of said input information signal.

45. The method of claim 44, wherein said compression parameter is a gain code.

* * * * *